US009006577B2

(12) United States Patent
Leifer et al.

(10) Patent No.: US 9,006,577 B2
(45) Date of Patent: Apr. 14, 2015

(54) APPARATUS FOR DETACHABLE ATTACHMENT OF AN ELECTRICAL CONDUCTOR TO A CURRENT TRANSFORMER HOUSING

(75) Inventors: Christoph Leifer, Bad Driburg (DE); Carsten Thorner, Melle (DE); Dat-Minh Trinh, Barntrup (DE)

(73) Assignee: Phoenix Contact GmbH & Co. KG, Blomberg (DE)

( * ) Notice: Subject to any disclaimer, the term of this patent is extended or adjusted under 35 U.S.C. 154(b) by 254 days.

(21) Appl. No.: 13/877,959

(22) PCT Filed: Oct. 7, 2011

(86) PCT No.: PCT/EP2011/067610
§ 371 (c)(1),
(2), (4) Date: Jul. 23, 2013

(87) PCT Pub. No.: WO2012/045884
PCT Pub. Date: Apr. 12, 2012

(65) Prior Publication Data
US 2013/0292151 A1 Nov. 7, 2013

(30) Foreign Application Priority Data

Oct. 7, 2010 (DE) .......................... 10 2010 038 040
Oct. 7, 2010 (DE) ...................... 20 2010 008 746 U

(51) Int. Cl.
*H02G 5/00* (2006.01)
*H05K 5/02* (2006.01)
*H01F 38/30* (2006.01)
*H01R 4/46* (2006.01)
*H05K 13/04* (2006.01)

(52) U.S. Cl.
CPC ......... *H05K 5/0247* (2013.01); *Y10T 29/49117* (2015.01); *H01F 38/30* (2013.01); *H01R 4/46* (2013.01); *H05K 13/04* (2013.01)

(58) Field of Classification Search
USPC .............. 174/50, 135; 439/261, 257; 411/554
See application file for complete search history.

(56) References Cited

U.S. PATENT DOCUMENTS 5,177,325 A * 1/1993 Giammanco .................... 174/50
5,783,775 A * 7/1998 Marusinec ....................... 174/50

(Continued)

FOREIGN PATENT DOCUMENTS

DE 19733852 2/1999
DE 19833150 10/1999

(Continued)

OTHER PUBLICATIONS

English Language Abstract of DE 19733852 published Feb. 11, 1999.

(Continued)

*Primary Examiner* — Dhirubhai R Patel
(74) *Attorney, Agent, or Firm* — DLA Piper LLP (US)

(57) ABSTRACT

Systems and methods for detachable attachment of an electrical conductor to current transformer housing are disclosed. An illustrative device may [comprise] includes a current transformer housing, a holding element which is passed through the current transformer housing, and an attachment element which passes through the holding element, with the attachment element and/or the holding element resting at least partially on the surface of the electrical conductor when the electrical conductor is attached to the apparatus, the attachment element being rotatable about its longitudinal axis for attaching or releasing the electrical conductor. Moreover, the holding element may be rotatable about its longitudinal axis such that, in a first position, the holding element can be moved along its longitudinal axis for attaching or releasing the electrical conductor and, in a second position, the holding element cannot be moved along its longitudinal axis.

15 Claims, 3 Drawing Sheets

(56) References Cited

U.S. PATENT DOCUMENTS

| | | | |
|---|---|---|---|
| 6,146,217 A * | 11/2000 | Osada | 439/835 |
| 6,395,979 B1 * | 5/2002 | English | 174/50 |
| 6,683,249 B1 * | 1/2004 | Leppin | 174/50 |
| 2012/0315778 A1 | 12/2012 | Leifer et al. | |

FOREIGN PATENT DOCUMENTS

| | | |
|---|---|---|
| DE | 102009059007 | 6/2011 |
| FR | 2130753 | 11/1972 |

OTHER PUBLICATIONS

Enlglish Language Abstract of DE 19833150 published Oct. 14, 1999.
English Language Abstract of FR 2130753 published Nov. 10, 1972.
International Preliminary Report on Patentability issued in PCT/EP2011/067610 on Apr. 9, 2013.
International Search Report issued in PCT/EP2011/067610 on Mar. 22, 2012.
English Language Abstract of DE 102009059007 published Jun. 22, 2011.

* cited by examiner

APPARATUS FOR DETACHABLE ATTACHMENT OF AN ELECTRICAL CONDUCTOR TO A CURRENT TRANSFORMER HOUSING

CROSS REFERENCE TO RELATED APPLICATIONS

This application is a U.S. National Stage Application of International Application No. PCT/EP 2011/067610 filed Oct. 7, 2011, which claims priority from German Patent Application Nos. 20 2010 008 746.5 and 10 2010 038 040.7 filed Oct. 7, 2010. The entirety of all the above-listed applications are incorporated herein by reference.

The invention relates to a device for detachably fastening a current conductor to a current transformer housing, comprising the current transformer housing, a retaining element that is guided through the current transformer housing, and a fastening element that is guided through the retaining element.

It is known from the prior art to guide a current conductor through an opening that is provided in a current transformer housing, wherein the current conductor is usually fastened to the current transformer housing by way of two screws or threaded pins, which are guided in two retaining elements arranged on the current transformer housing. For fastening purposes, the screws or the threaded pins are rotated inside the retaining elements in the direction of the current conductor by a purely rotatory motion until the cross-sectional surfaces thereof are seated on the surface of the current conductor. By continuing the rotation of the screws or the threaded pins, the current conductor is fixed in the current transformer housing.

The disadvantage here is that the threaded pins or the screws must cover a relatively long distance for the fastening on the current conductor, wherein this is achieved solely by a purely rotatory motion, which requires a lot of force and is very time-consuming, in particular if a larger number of current transformer housings are to be fixed on a current conductor.

Thus, it is the object of the invention to provide a device for fastening a current conductor to a current transformer housing, the device being characterized by simpler and faster installation.

The object is achieved according to the invention by the characteristics of the independent claim. Advantageous embodiments of the invention are described in the dependent claims.

A solution of the object described above thus consists in a device for detachably fastening a current conductor to a current transformer housing, comprising the current transformer housing, a retaining element that is guided through the current transformer housing, and a fastening element that is guided through the retaining element, wherein the fastening element and/or the retaining element are seated against at least some regions of the surface of the current conductor when the current conductor is fastened to the device, the fastening element can be rotated in a rotatory manner about the longitudinal axis thereof so as to fasten and/or detach the current conductor, and the retaining element can be rotated in a rotatory manner about the longitudinal axis thereof so that the retaining element, in a first rotational position, can be displaced in a translatory manner along the longitudinal axis thereof so as to fasten and/or detach the current conductor, and the retaining element, in a second rotational position, cannot be displaced in a translatory manner along the longitudinal axis thereof.

According to the invention, the current conductor can thus be fastened to the current transformer housing by a rotatory motion of the fastening element and/or by a translatory motion of the fastening element, which is to say by two basically independent motions of the retaining element and the fastening element. Because the fastening element is guided through the retaining element, a translatory displacement of the retaining element also moves the fastening element in a translatory manner. To this end, according to the invention, first the current conductor can be fixed by a rotatory motion of the fastening element, which is to say, for example, the fastening element is designed as a screw, which can be rotated in a rotatory manner about the longitudinal axis thereof in a nut that is associated with the retaining element. Second, the retaining element is designed as a "quick displacement" means for fastening the current conductor, so that, in a first rotational position, the retaining element can be freely displaced toward the current conductor or away from the current conductor and, in a second rotational position, which is rotated 90° relative to the first rotational position, for example, cannot be displaced in a translatory manner, which is to say in the second rotational position, the element is fixed on the current transformer housing with respect to a translatory motion along the longitudinal axis thereof. It is thus also possible according to the device according to the invention, to first move the retaining element, in the first rotational position, in a translatory manner along the longitudinal axis thereof toward the current conductor, then rotate the retaining element in a rotatory manner into the rotational position thereof so that thereafter the current conductor can be fixed by a rotatory motion of the fastening element. Such a procedure or device according to the invention has the enormous advantage that the current conductor can be fastened with particular precision and particularly securely on the current transformer housing by such "quick fastening" of the translatory motion in conjunction with a "fine adjustment" of the rotatory motion.

The fastening element and/or the retaining element preferably each have the shape of an elongated pin-like element, which for the purpose of fastening the current conductor can be moved in the direction along the longitudinal axis thereof. So as to fasten the current conductor, the fastening element and/or the retaining element can be moved in the direction of the current conductor, and so as to detach the current conductor, the fastening element and/or the retaining element can be moved away from the current conductor, wherein the fastening element and the retaining element are preferably arranged relative to the current conductor, or are guided relative to the current conductor, so that the longitudinal axis of the fastening element or of the retaining element is arranged substantially transversely relative to the longitudinal axis of the current conductor. In the fastened state, in which the current conductor is fixed on the current transformer housing, the respective cross-sectional surface of the fastening element and/or of the retaining element is preferably seated against the surface of the current conductor. So as to fasten the current conductor to the current transformer housing, for one, as described above, the fastening element can be rotated in a rotatory manner about the longitudinal axis thereof, and secondly, the retaining element can be displaced in a translatory manner along the longitudinal axis thereof, wherein preferably a larger displacement takes place toward the current conductor by the translatory motion of the retaining element. The current transformer housing may further comprise a plastic locking bar or a flange, which can be arranged on a lateral face of the current transformer housing, for example, wherein the retaining element is guided in the flange.

It is thus possible by the device according to the invention to significantly reduce both the complexity of the installation of the current transformer housing on the current conductor and the time that is required to do so, so that the device according to the invention allows quick fastening of a current conductor to a current transformer housing. This quick fastening can preferably be carried out without requiring an additional tool for fastening. So as to achieve uniform fastening of the current conductor to the current transformer housing, a retaining element, having a fastening element arranged therein, is preferably provided on each of two mutually opposing lateral faces of the current transformer housing.

The retaining element can generally have any arbitrary design so as to allow a purely translatory motion along the longitudinal axis thereof in the first rotational position, and suppress a translatory motion along the longitudinal axis thereof in the second rotational position. According to an advantageous embodiment of the invention, however, in a second region extending in the longitudinal axis of the retaining element, the current transformer housing and the retaining element each have a mutually engaging tongue-and-groove-like surface and the second region corresponds to the second rotational position. According to this embodiment, the current transformer housing and the retaining element preferably each have a tongue-and-groove-like surface, so that the tongue-and-groove-like surface is formed only along the second region extending in the longitudinal axis of the retaining element. In other words, according to this embodiment, the respective tongue-and-groove-like surface is formed only in some regions of the retaining element and of the current transformer housing, for example in a manner comparable to a regionally provided "external thread" on the retaining element and an "internal thread" that is regionally provided on the current transformer housing so as to receive the "external thread". By the respective tongue-and-groove-like surfaces in the second region engaging with each other, the retaining element cannot be displaced in a translatory manner in this second rotational position.

A variety of options exist to allow the translatory motion in the first rotational position. However, according to a particularly preferred embodiment of the invention, the current transformer housing and/or the retaining element comprise a respective substantially planar surface in a first region extending in the longitudinal axis of the retaining element, and the first region corresponds to the first rotational position. Because at least the current transformer housing or the retaining element thus has a substantially planar surface in the first region, which is to say has a smooth surface, for example, the retaining element can carry out a translatory motion relative to the current transformer housing, and is thus not inhibited in the translatory motion thereof, as in the embodiment described above, for example by mutually engaging tongue-and-groove-like surfaces or the friction created thereby. Such configurations thus make particularly simple embodiments possible so as to allow the translatory motion of the retaining element in the first rotational position thereof, or suppress this in the second rotational position thereof.

According to an alternative preferred embodiment, the retaining element has a tongue-and-groove-like surface in a first region extending in the longitudinal axis of the retaining element, the outside diameter of the retaining element along the longitudinal axis thereof is smaller in the first region than in the second region, and the first region corresponds to the first rotational position. According to this embodiment, the retaining element thus has a tongue-and-groove-like surface both in the first region and in the second region, however the tongues have a larger diameter in the second region than in the first region, whereby the retaining element can be displaced in a translatory manner in the first rotational position and cannot be displaced in a translatory manner in the second rotational position. In a region that corresponds to the first region in the first rotational position, the current transformer housing preferably has a substantially planar surface, so that the tongue-and-groove-like surface of the first region cannot engage in the corresponding region of the current transformer housing in the first rotational position. It is further preferred in this connection for the groove-like surface of the retaining element to be designed as an opening. This has the advantage that the retaining element can be produced with a lower weight.

In general, the fastening element and/or the retaining element can be designed as any arbitrary means for fastening the current conductor that are known to the person skilled in the art from the prior art. According to a particularly preferred embodiment of the invention, however, the fastening element is designed as a screw, the retaining element comprises a thread, and the screw can be rotated in the thread in a rotatory manner so as to fasten or detach the current conductor. The fastening element can thus be implemented in a particularly simple manner and easily be rotatably fixed on the retaining element in a rotatory manner. The thread is preferably designed as a nut, as a square nut, as a hexagon nut and/or as an insert nut.

According to a further preferred embodiment of the invention, the device comprises a receiving element that is arranged on the current transformer housing, wherein the retaining element is guided through the receiving element, and the receiving element is detachably fastened to the current transformer housing. This means that the receiving element, together with the retaining element that is guided through the receiving element and the fastening element that is arranged therein, can also, for example, be subsequently fastened to the current transformer housing, which is to say in the manner of a retrofit for an existing current transformer housing, whereby particularly universal use with diverse usage options is obtained. To this end, the receiving element and/or the current transformer housing preferably comprise means for detachably attaching the receiving element on the current transformer housing, such as detent means, for example, which allow particularly easy attachment and removal.

A variety of options are also conceivable as far as the design of the retaining element is concerned. According to a preferred embodiment of the invention, however, the retaining element has a substantially circular cross-section, and the first region and the second region each cover a circumferential arc of 90° or 180°. It is therefore also preferred for the first rotational position to be arranged 90° or 180° from the second rotational position. Further extensions of the first and/or second regions are likewise possible, for example 45° or 22.5°, which is to say preferably sub-regions that can be combined with each other. This means that, according to this preferred embodiment of the invention, the retaining element, along the surface thereof extending in the longitudinal direction, comprises two mutually opposing regions, each having a circumferential arc of 90°, which comprise the tongue-and-groove-like surface and which comprise two respective regions having planar surfaces between the tongue-and-groove-like surfaces. According to this example, the surface of the current transformer housing corresponding to the surface of the retaining element would have to be designed accordingly, which is to say to design two regions having a respective circumferential arc of 90° with a tongue-and-groove-like surface, which are each interrupted by two planar regions, each likewise having a circumferential arc of 90°.

According to a further preferred embodiment of the invention, the retaining element and/or the fastening element each comprise a head having a knurl-like grip surface. The grip surface is preferably designed as a tongue-and-groove-like outer circumferential surface. The grooves and tongues are preferably oriented parallel to the longitudinal axis of the retaining element or fastening element. Such a head allows the retaining element and/or the fastening element to be moved very easily in a translatory and/or rotatory manner.

The object is further achieved by a method for fastening a current conductor to a current transformer housing using a retaining element and/or using a fastening element, comprising the current transformer housing, the retaining element that is guided through the current transformer housing, and the fastening element that is guided through the retaining element, wherein the fastening element and/or the retaining element are seated against at least some regions of the surface of the current conductor when the current conductor is fastened, and the retaining element can be rotated in a rotatory manner about the longitudinal axis thereof from a first rotational position into a second rotational position, comprising the following steps: in the first rotational position, displacing the retaining element along the longitudinal axis thereof toward the current conductor; rotating the retaining element into the second rotational position, wherein, in the second rotational position, the retaining element cannot be displaced in a translatory manner along the longitudinal axis thereof; and rotating the fastening element in a rotatory manner about the longitudinal axis thereof toward the current conductor.

Such a method according to the invention allows a current conductor to be fixed particularly easily and quickly to the current transformer housing, wherein, within the meaning of "quick fastening", the retaining element is preferably first guided in a purely translatory manner until impinging on the current conductor, and only for final fixation on the surface of the current conductor performs a rotatory motion for "fine adjustment". This allows the installation time and the installation complexity to be considerably reduced.

Further advantages and embodiments for the methods according to the invention will be apparent to a person skilled in the art analogously to what has been described above with respect to the device according to the invention.

The invention will be described hereafter in more detail based on preferred exemplary embodiments with reference to the drawings.

Figure 1:
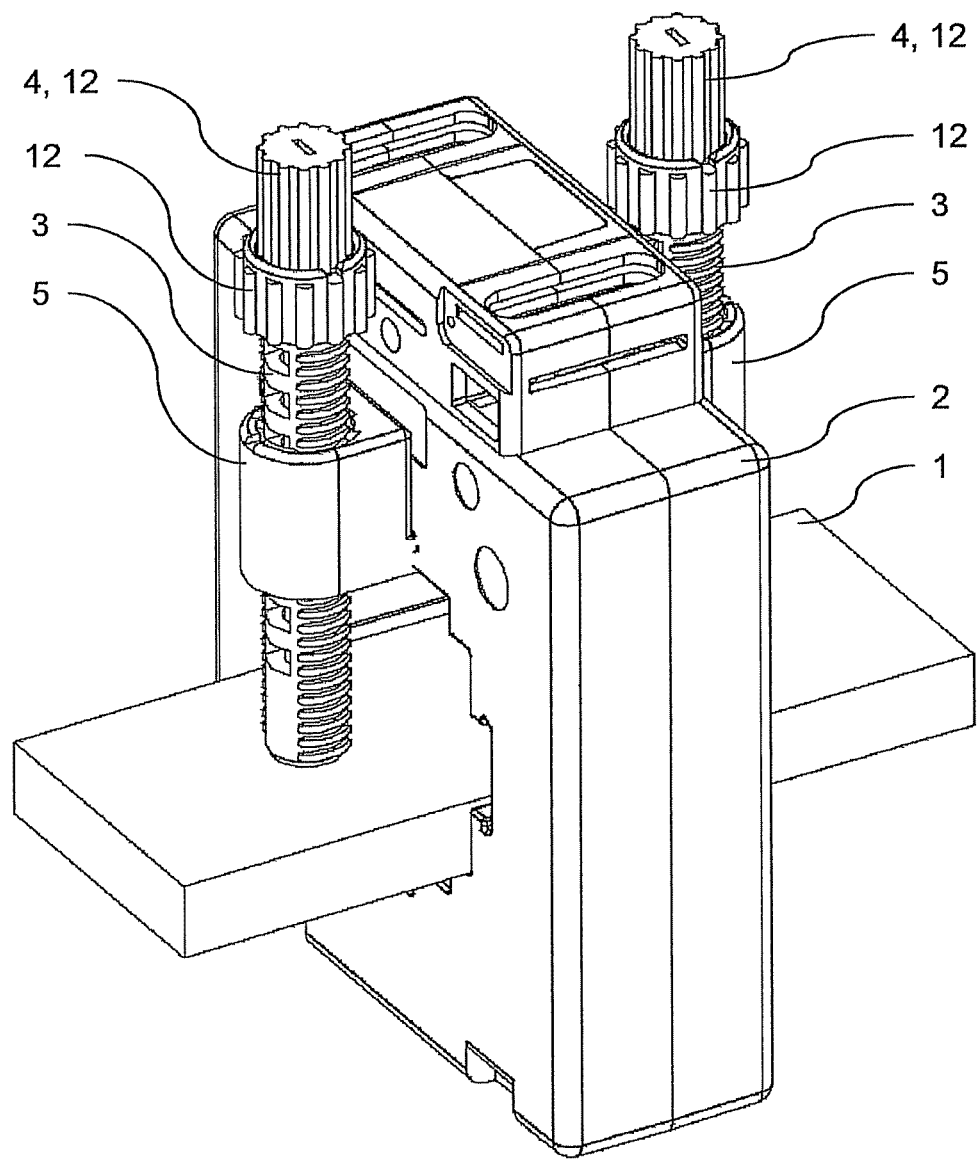
FIG. 1 is a perspective view of a device for detachably fastening a current conductor to a current transformer housing according to a preferred exemplary embodiment of the invention.

FIG. 1 shows a device for detachably fastening a current conductor 1 to a current transformer housing 2 using a retaining element 3 and/or using a fastening element 4. To this end, the retaining element 3 is guided through a receiving element 5, which can be detachably fastened to the current transformer housing 2. The receiving element 5 can be latchingly engaged with the current transformer housing 2 by way of a detent means, which is not shown. As an alternative, when the current conductor 1 is fastened to the current transformer housing 2, the receiving element 5 can also be pressed against the current transformer housing 2 by the retaining element 3 or the fastening element 4, so that no additional fastening means is required for fastening the receiving element 5 to the current transformer housing 2.

Figure 2:
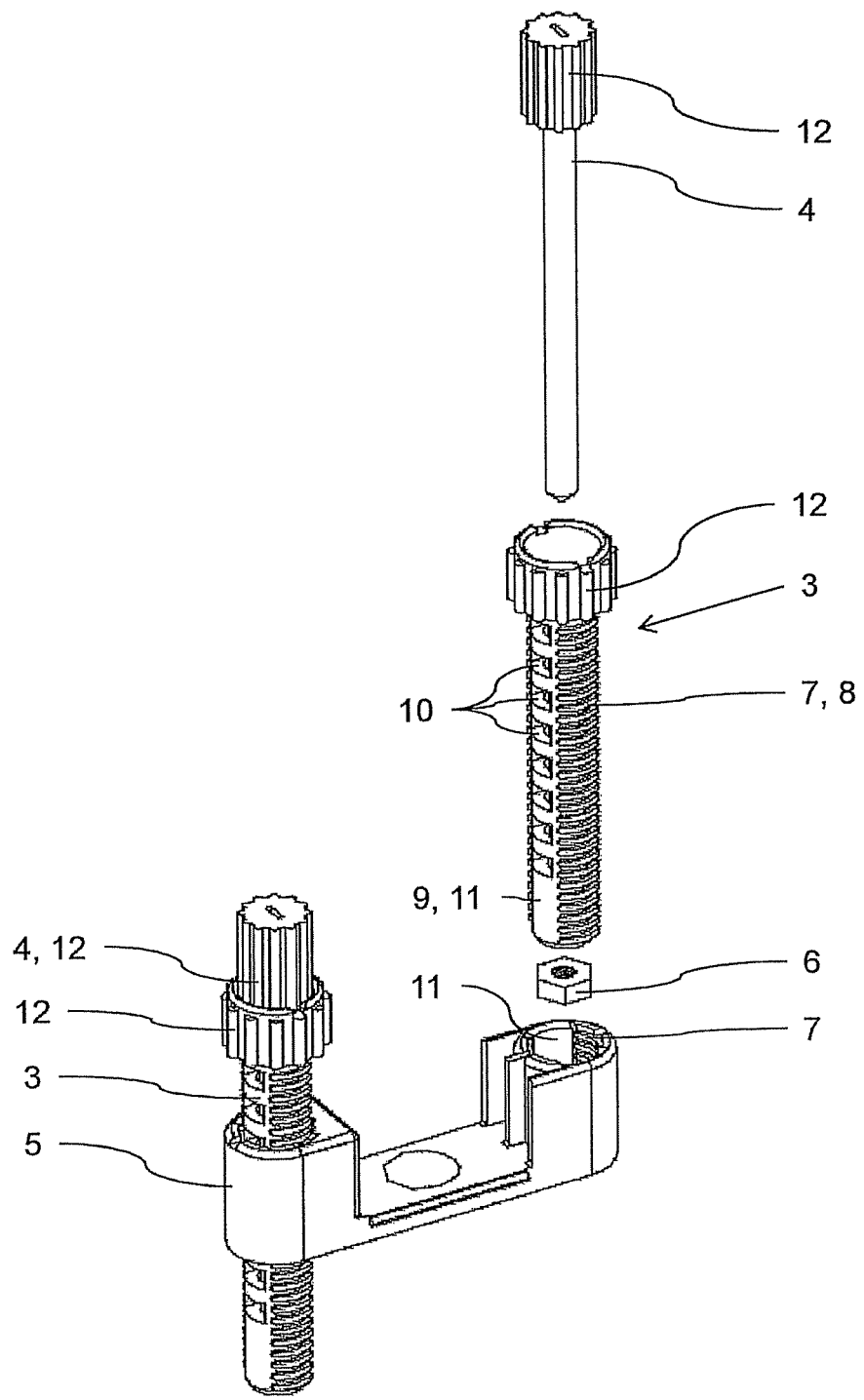
FIG. 2 is a perspective exploded view of a receiving element, comprising a retaining element and a fastening element according to the preferred exemplary embodiment of the invention.

As is apparent from FIG. 2, for example, the fastening element 4 designed as a screw is guided through the retaining element 3 so that the screw 4 can be rotated in a thread 6 designed as nut in a rotatory manner about the longitudinal axis thereof, so as to fasten the current conductor 1 on the current transformer housing 2.

The retaining element 3 can be rotated in a rotatory manner about the longitudinal axis thereof in the receiving element 5 so that, in a first rotational position, the retaining element 3 can be displaced in a translatory manner along the longitudinal axis thereof so as to fasten or release the current conductor 1, and in a second rotational position, the retaining element 3 cannot be displaced in a translatory manner along the longitudinal axis thereof. For this purpose, both the receiving element 5 and the retaining element 3 comprise a tongue-and-groove-like surface 7, which engage with each other in the second rotational position, so that the retaining element 3 cannot be displaced in a translatory manner relative to the receiving element 3.

Figure 3:
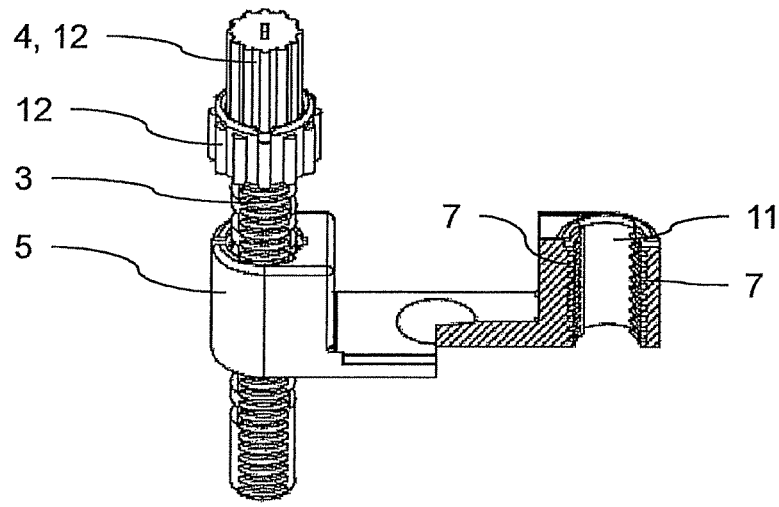
FIG. 3 is a perspective partial sectional view of the receiving element according to the previous figure.
Figure 4:
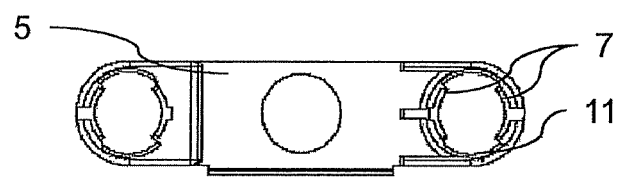
FIG. 4 is a top view onto the receiving element according to the preferred exemplary embodiment of the invention.

As is apparent from FIGS. 2 to 4, the retaining element 3 comprises a second region 8 for this purpose along the outer surface thereof extending in the longitudinal axis, the region covering a respective quarter of the outer circumference of the surface on the "front" and "back" of the retaining element 3, as is apparent from FIG. 2. A first region 9, which likewise has a tongue-and-groove like surface 7, is located between the tongue-and-groove-like surfaces 7 of the second region 8, wherein the grooves are designed as openings 10 in this first region 9.

If this first region 9 of the retaining element 3, in the first rotational position, is now aligned in the receiving element 5 in a corresponding manner with a planar surface 11 of the receiving element 5, the retaining element 3 can be displaced, in this first rotational position, in a translatory manner along the longitudinal axis thereof in the receiving element 5 so as to fasten or detach the current conductor 1. For easy actuation, the retaining element 3 and the fastening element 4 each comprise a head 12, for example the screw comprises an encapsulated head 12.

The following procedure is preferred so as to fasten the current conductor 1 to the current transformer housing 2: In the first rotational position, with the planar surfaces 11 of the retaining element 3 and of the receiving element 5 corresponding to each other, the retaining element 3 is displaced in a translatory manner in the receiving element 5 in the direction of the current conductor 1. As soon as the retaining element 3 makes contact with the current conductor 1 or is aligned as close to the surface of the current conductor 1 as possible, the retaining element 3 is rotated in a rotatory manner relative to the receiving manner 5 into the second rotational position. In this second rotational position, the regionally provided tongue-and-groove-like surfaces 7 of the retaining element 3 and of the receiving element 5 engage in each other so that the retaining element 3 cannot be displaced in a translatory manner along the longitudinal axis thereof. For final fixation, now a rotatory motion of the fastening element 4, which is to say of the fastening element 4 designed as a screw, is carried out in the thread 6. As a result, the installation time and the installation complexity can be significantly reduced over devices known from the prior art.

List of Reference Numerals
current conductor 1
current transformer housing 2
retaining element 3
fastening element 4
receiving element 5
thread 6
tongue-and-groove-like surface 7
second region 8
first region 9
opening 10
planar surface 11
head 12

The invention claimed is:

1. A device for detachably fastening a current conductor to a current transformer housing, comprising:
   the current transformer housing, wherein the current transformer housing has an opening and the conductor is guided through the opening,
   a retaining element that is guided through a throughhole of the current transformer housing, the retaining element passing through the throughhole along a longitudinal axis extending in direction towards and away from the current conductor, and
   a fastening element that is guided through the retaining element,
   wherein the fastening element and/or the retaining element are seated against at least some regions of the surface of the current conductor when the current conductor is fastened to the device,
   wherein the fastening element can be rotated in a rotatory manner about the longitudinal axis thereof so as to fasten or detach the current conductor,
   wherein the retaining element comprises:
      a first region having a substantially planar surface that extends along the longitudinal axis of the retaining element, the first region corresponding to a first rotational position of the retaining element,
      a second region having tongue-and-groove like surfaces that engage with surfaces of the throughhole, the second region corresponding to a second rotational position of the retaining element, and
   wherein the retaining element can be rotated in a rotatory manner about the longitudinal axis thereof between the first rotational position and in the second rotational position, such that the retaining element, in the first rotational position, can be displaced in a translatory manner along the longitudinal axis thereof so as to fasten or release the current conductor, and in the second rotational position, the retaining element cannot be displaced in a translatory manner along the longitudinal axis thereof.

2. The device according to claim 1, wherein, in the first region extending in the longitudinal axis of the retaining element, the retaining element has the tongue-and-groove-like surfaces, the outside diameter of the retaining element along the longitudinal axis thereof is smaller in the first region than in the second region, and the first region corresponds to the first rotational position.

3. A device according to claim 1, wherein the tongue-and-groove-like surface is designed as an opening.

4. A device according to claim 1, wherein the fastening element is designed as a screw, the retaining element comprises a thread, and the screw can be rotated in the thread in a rotatory manner so as to fasten or detach the current conductor.

5. A device according to claim 1, comprising a receiving element that is arranged on the current transformer housing, wherein the retaining element is guided through the receiving element, and the receiving element is detachably fastened to the current transformer housing.

6. A device according to claim 1, wherein the retaining element has a substantially circular cross-section, and the first region and the second region each cover a circumferential arc of about 90 degrees or about 180 degrees.

7. A device according to claim 1, wherein the retaining element and/or the fastening element each comprise a head having a knurl-like grip surface.

8. A method for detachably fastening a current conductor to a current transformer housing, wherein the current transformer housing has an opening and the conductor is guided through the opening, using a retaining element and/or using a fastening element, comprising the current transformer housing, the retaining element that is guided through a throughhole of the current transformer housing, the retaining element passing through the throughhole along a longitudinal axis extending in direction towards and away from the current conductor, and the fastening element that is guided through the retaining element, wherein
   the fastening element and/or the retaining element are seated against at least some regions of the surface of the current conductor when the current conductor is fastened to the device, and
   wherein the retaining element comprises:
      a first region having a substantially planar surface that extends along the longitudinal axis of the retaining element, the first region corresponding to a first rotational position of the retaining element,
      a second region having tongue-and-groove like surfaces that engage with surfaces of the throughhole, the second region corresponding to a second rotational position of the retaining element, and
   the retaining element can be rotated in a rotatory manner about the longitudinal axis thereof from a first rotational position into a second rotational position, comprising the following steps:
      in the first rotational position, displacing the retaining element in a translatory manner along the longitudinal axis thereof toward the current conductor;
      rotating the retaining element into the second rotational position, wherein in the second rotational position the retaining element cannot be displaced in a translatory manner along the longitudinal axis thereof; and
      rotating the fastening element in a rotatory manner about the longitudinal axis thereof toward the current conductor to fasten the current conductor.

9. A device for detachably fastening a current conductor to a current transformer housing, the device comprising:
   the current transformer housing, wherein the current transformer housing has an opening and the conductor is guided through the opening,
   a receiving element that is arranged on the current transformer housing, and which is detachably fastened to the current transformer housing,
   a retaining element that is guided through a throughhole of the receiving element, the retaining element passing through the throughhole along a longitudinal axis extending in direction towards and away from the current conductor, and
   a fastening element that is guided through the retaining element, wherein the fastening element and/or the retaining element are seated against at least some regions of the surface of the current conductor when the current conductor is fastened to the device, wherein the fastening element can be rotated in a rotatory manner about the longitudinal axis thereof so as to fasten or detach the current conductor, wherein the retaining element comprises:
   a first region having a substantially planar surface that extends along the longitudinal axis of the retaining element, the first region corresponding to a first rotational position of the retaining element,
   a second region having tongue-and-groove like surfaces that engage with surfaces of the throughhole, the second region corresponding to a second rotational position of the retaining element, and wherein the retaining element can be rotated in a rotatory manner about the longitudinal axis thereof between the first rotational position and in the second rotational position, wherein the retaining element, in the first rotational position, can be displaced in a translatory manner along the longitudinal axis thereof so as to fasten or release the current conductor, and in the second rotational position, the retaining element cannot be displaced in a translatory manner along the longitudinal axis thereof.

10. The device according to claim 9 wherein, in the first region extending in the longitudinal axis of the retaining element, the retaining element has the tongue-and-groove-like surfaces, the outside diameter of the retaining element along the longitudinal axis thereof is smaller in the first region than in the second region, and the first region corresponds to the first rotational position.

11. The device according to claim 9 wherein the tongue-and-groove-like surface is designed as an opening.

12. The device according to claim 9 wherein the fastening element is designed as a screw, the retaining element comprises a thread, and the screw can be rotated in the thread in a rotatory manner so as to fasten or detach the current conductor.

13. The device according to claim 9 further comprising a receiving element that is arranged on the current transformer housing, wherein the retaining element is guided through the receiving element, and the receiving element is detachably fastened to the current transformer housing.

14. The device according to claim 9 wherein the retaining element has a substantially circular cross-section, and the first region and the second region each cover a circumferential arc of about 90 degrees or about 180 degrees.

15. The device according to claim 9 wherein the retaining element and/or the fastening element each comprise a head having a knurl-like grip surface.

\* \* \* \* \*